(12) United States Patent
Goldberger et al.

(10) Patent No.: US 7,781,317 B2
(45) Date of Patent: Aug. 24, 2010

(54) METHOD OF NON-CATALYTIC FORMATION AND GROWTH OF NANOWIRES

(75) Inventors: Joshua Goldberger, North Canton, OH (US); Melissa Fardy, Berkeley, CA (US); Oded Rabin, San Francisco, CA (US); Allon Hochbaum, Berkeley, CA (US); Minjuan Zhang, Ann Arbor, MI (US); Peidong Yang, El Cerrito, CA (US)

(73) Assignees: Toyota Motor Engineering & Manufacturing North America, Inc., Erlanger, KY (US); The Regents of the University of California

( * ) Notice: Subject to any disclaimer, the term of this patent is extended or adjusted under 35 U.S.C. 154(b) by 530 days.

(21) Appl. No.: 11/619,413

(22) Filed: Jan. 3, 2007

(65) Prior Publication Data

US 2008/0157031 A1   Jul. 3, 2008

(51) Int. Cl.
*H01L 21/20* (2006.01)
(52) U.S. Cl. .................. 438/584; 977/840; 977/842; 977/843; 977/844; 977/890; 977/895; 977/896; 977/897; 977/898; 977/899
(58) Field of Classification Search ............... 438/584; 977/840, 842, 843, 844, 890, 895, 896, 897, 977/898, 899
See application file for complete search history.

(56) References Cited

U.S. PATENT DOCUMENTS 6,465,132 B1   10/2002   Jin (Continued)

FOREIGN PATENT DOCUMENTS

WO    WO 02/073699    9/2002

(Continued)

OTHER PUBLICATIONS

Wang et al. (A Novel Pathway to PbSe Nanowires at Room Temperature, Adv. Mater. 1998, 1479-1481).*

*Primary Examiner*—George Fourson
*Assistant Examiner*—John M Parker
(74) *Attorney, Agent, or Firm*—Gifford, Krass, Spinkle, Anderson & Citkowski, P.C.

(57) ABSTRACT

A method for the non-catalytic growth of nanowires is provided. The method includes a reaction chamber with the chamber having an inlet end, an exit end and capable of being heated to an elevated temperature. A carrier gas with a flow rate is allowed to enter the reaction chamber through the inlet end and exit the chamber through the exit end. Upon passing through the chamber the carrier gas comes into contact with a precursor which is heated within the reaction chamber. A collection substrate placed downstream from the precursor allows for the formation and growth of nanowires thereon without the use of a catalyst. A second embodiment of the present invention is comprised of a reaction chamber, a carrier gas, a precursor target, a laser beam and a collection substrate. The carrier gas with a flow rate and a gas pressure is allowed to enter the reaction chamber through an inlet end and exit the reaction chamber through the exit end. The laser beam is focused on the precursor target which affords for the evaporation of the precursor material and subsequent formation and growth of nanowires on the collection substrate.

24 Claims, 9 Drawing Sheets

U.S. PATENT DOCUMENTS

| | | | |
|---|---|---|---|
| 7,129,154 B2 * | 10/2006 | Yi | 438/504 |
| 7,517,718 B2 * | 4/2009 | Mitzi et al. | 438/95 |
| 2008/0038520 A1 * | 2/2008 | Pan et al. | 428/209 |
| 2008/0038521 A1 * | 2/2008 | Robbins | 428/209 |
| 2008/0092938 A1 * | 4/2008 | Majumdar et al. | 136/200 |
| 2008/0230849 A1 * | 9/2008 | Afzali-Ardakani et al. | 257/391 |

FOREIGN PATENT DOCUMENTS

| | | |
|---|---|---|
| WO | WO 02/080280 | 10/2002 |
| WO | WO 2004/055912 | 7/2004 |

* cited by examiner

METHOD OF NON-CATALYTIC FORMATION AND GROWTH OF NANOWIRES

FIELD OF THE INVENTION

The present invention in general relates to the nucleation and growth of nanowires and in particular the non-catalytic nucleation and growth of nanowires.

BACKGROUND OF THE INVENTION

Nanoscale wires, also known as nanowires, have received considerable attention in recent years. One reason for such attention is the unique physical properties these one-dimensional structures can exhibit. For example, nanowires can exhibit quantum conductance and ballistic transport characteristics. In addition, one can use the size effect of nanowires as an effective means to tune the electronic and thermal properties of these materials.

The size effect includes two influences. The first influence is the confined dimension of a nanowire, which may modify the electronic band structure and phonon dispersion relationship, resulting in discrete electronic density of states and reduced phonon group velocity. This influence is defined as a confinement effect. The second influence is the high surface area present in nanowire structures, which introduces an increase in boundary scattering for both electrons and phonons. This influence can be defined as a surface effect.

The confinement and surface effects can be used to offer advantages over traditional bulk materials including: (1) enhancement of a parameter known as the Seebeck due to an increase of the density of states near the Fermi level; (2) increased carrier mobilities at a given carrier concentration due to quantum confinement and modulation doping; and (3) exploitation of the different length scales of phonon and electron scattering resulting in increased boundary scattering of phonons while effectively preserving electric carrier mobilities. These properties can have a beneficial effect on the development of high-efficiency thermoelectric materials.

Thermoelectric materials are important for power generation devices that convert waste heat into electrical energy. They can also be used in solid-state refrigeration devices. However, the widespread application of thermoelectric devices has been limited by their relatively low efficiency.

The efficiency performance of a thermoelectric device is defined by a dimensionless figure known as ZT, which is defined as $$ZT = S^2 \sigma T / K_t$$

where S is the Seebeck coefficient, $\sigma$ is the electrical conductivity, T is the absolute temperature and $K_t$ is the total thermal conductivity. ZT is roughly proportional to efficiency, wherein a ZT of 1 corresponds to an efficiency of approximately 10%.

Increasing ZT has proven difficult because the three parameters S, $\sigma$ and $K_t$ are all related to the free carrier concentration of electrons and thus are not independent. For example, doping of a material can increase a semiconductor's electrical conductivity, but also results in a decrease in the materials Seebeck coefficient and an increase in its thermal conductivity. Also, efforts to reduce the lattice thermal conductivity by alloying of the material also reduces the electrical conductivity by providing extra scattering mechanisms. Thus from the above equation, it can be seen that obtaining an enhancement in one quantity typically results in undesirable results in another quantity, and thus a failure to increase ZT overall.

In contrast to the difficulties in increasing ZT as stated above, the use of nanowires has provided a possible avenue for increasing ZT. However, methods developed thus far for the formation and growth of nanowires have used catalyst materials. The use of a catalyst in the growth of nanowires can result in contamination of the nanowire material and additional steps to remove the catalyst from the nanowires. Therefore, there is a need for a non-catalytic method for the formation and growth of nanowires.

SUMMARY OF THE PRESENT INVENTION

A method for the non-catalytic growth of nanowires is provided. The method includes a reaction chamber with the chamber having an inlet end and an exit end. The chamber is capable of being heated to an elevated temperature. A carrier gas with a flow rate is allowed to enter the reaction chamber through the inlet end and exit the chamber through the exit end. Upon passing through the chamber the carrier gas comes into contact with a precursor which is heated within the reaction chamber and subsequently passes over and contacts a collection substrate. The precursor is comprised of $PbCl_2$, $SeCl_2$, $TeCl_2$, S and combinations thereof. The collection substrate placed downstream from the precursor allows for the formation and growth of nanowires thereon without the use of a catalyst. Examples of the formation and growth of PbS, PbSe and PbTe nanowires are demonstrated using the method of the present invention.

A second embodiment of the present invention is comprised of a reaction chamber, a carrier gas, a precursor target, a laser beam and a collection substrate. The reaction chamber has an inlet end and an exit end, and can be heated to an elevated temperature. The carrier gas with a flow rate and under pressure is allowed to enter the reaction chamber through an inlet end and exit the reaction chamber through the exit end. The laser beam is focused on the precursor target which affords for the evaporation of the precursor material, which is subsequently transported by the carrier gas to the collection substrate where formation and growth of nanowires occurs. The formation and growth of nanowires using a precursor target of PbX, wherein X is Se, Te, S and combinations thereof, is demonstrated using the second embodiment of the present invention.

DETAILED DESCRIPTION OF THE PRESENT INVENTION

The present invention employs a non-catalytic process for the formation and growth of nanowires. For the purposes of the present invention, "non-catalytic" is defined as a process in which a foreign material is not used to aid in the nucleation and growth of said nanowires. Foreign material is defined as any condensed material that is not the same element or elements as the nanowires formed and grown using the disclosed process. Furthermore, the term "nanowire" is defined as an article having a mean linear diameter of less than 500 nanometers and a length of greater than 1 micron.

Figure 1:
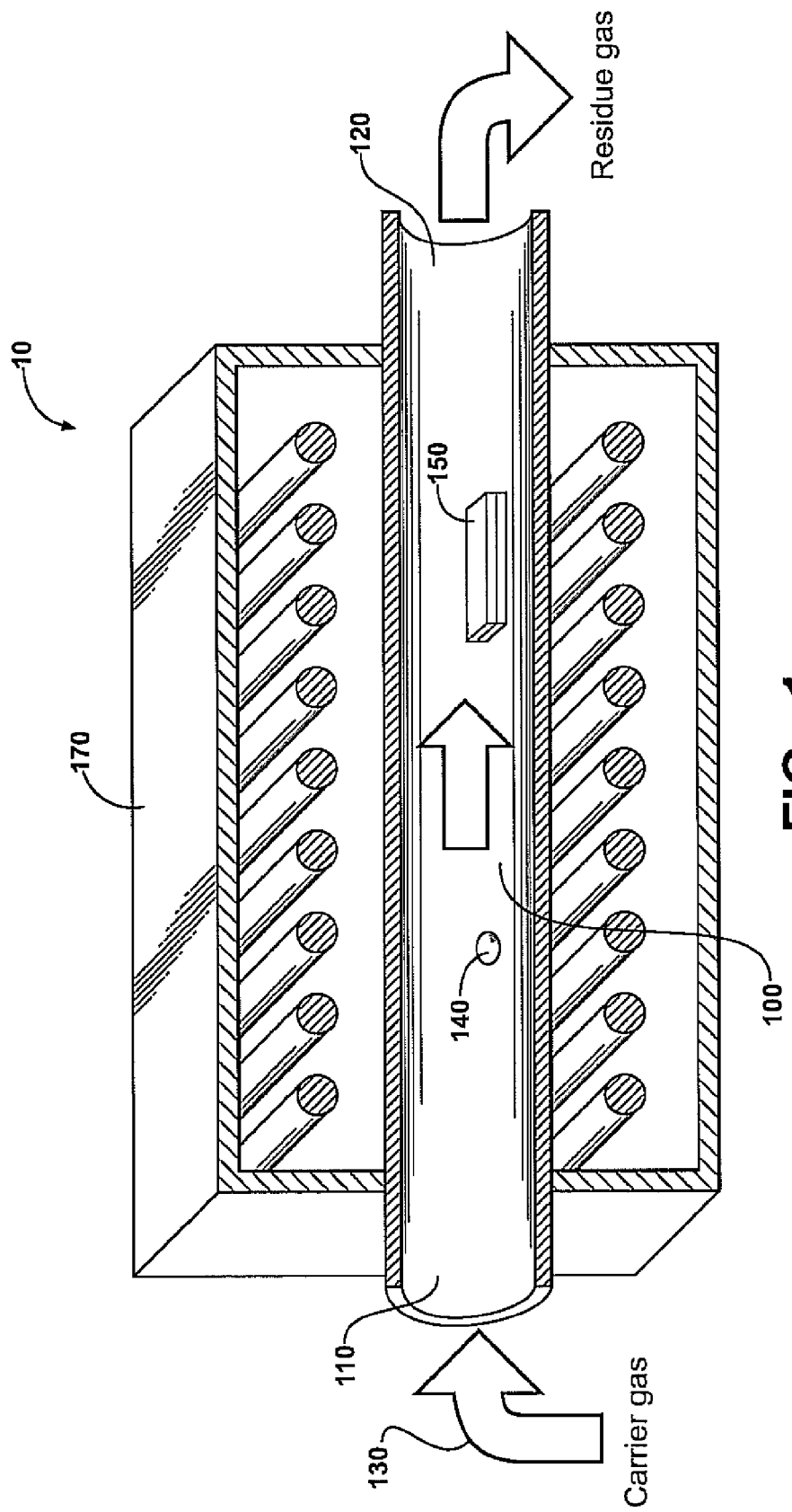
FIG. 1 is a schematic diagram of a first embodiment of the present invention.

Turning to FIG. 1, an apparatus for the execution of a first embodiment of the present invention is shown generally at 10. The method is comprised of the use of a reaction chamber 100, a carrier gas 130, a precursor 140 and a collection substrate 150. The reaction chamber 100, with precursor 140 and collection substrate 150 held therein, is capable of being heated to an elevated temperature using furnace 170. The carrier gas 130 enters reaction chamber 100 at an inlet end 110 and exits said chamber at an exit end 120. Using this apparatus, the first embodiment method heats the reaction chamber 100 to an elevated temperature using furnace 170, and carrier gas 130 is caused to flow over precursor 140 and collection substrate 150. Material evaporated from precursor 140 at the elevated temperature is transported by the carrier gas 130 and deposited onto the collection substrate 150.

The reaction chamber 100 is made from any material known to those skilled in the art, illustratively including alumina, silica, mullite and combinations thereof. The carrier gas 130 is typically an inert and/or noble gas, illustratively including nitrogen, argon, hydrogen and combinations thereof. The precursor 140 can include lead chloride ($PbCl_2$), selenium chloride ($SeCl_2$), tellurium chloride ($TeCl_2$), sulfur (S) and combinations thereof. The collection substrate 150 can include any material known to those skilled in the art, illustratively including silicon and preferably a (111) silicon wafer. The furnace 170 can heat the reaction chamber 100 and the contents therein at temperatures up to 1200 degrees centigrade (° C.). In the alternative, the furnace 170 can heat reaction chamber 100 and the contents therein to temperatures above 1200° C.

Examples of the first embodiment of the present invention are described below for illustrative purposes only and in no way limit the scope of the present invention. It is important to note that a catalyst, catalytic particles, droplets, wires or any other type of article is not used in the present invention.

Example 1

Lead sulfur (PbS) nanowires were produced using the method described above wherein furnace 170 was used to heat the reaction chamber 100 to a temperature between 600 to 700° C. A carrier gas 130 of pure nitrogen with a gas flow rate of between 50 to 150 standard cubic centimeters per minute (scam) was used. The precursor 140 included $PbCl_2$ and S. The ratio of the mass of $PbCl_2$ to the mass of S was between 1:1 to 1:5. Preferably the ratio of $PbCl_2$ to S is 1:3.6.

Figure 2:
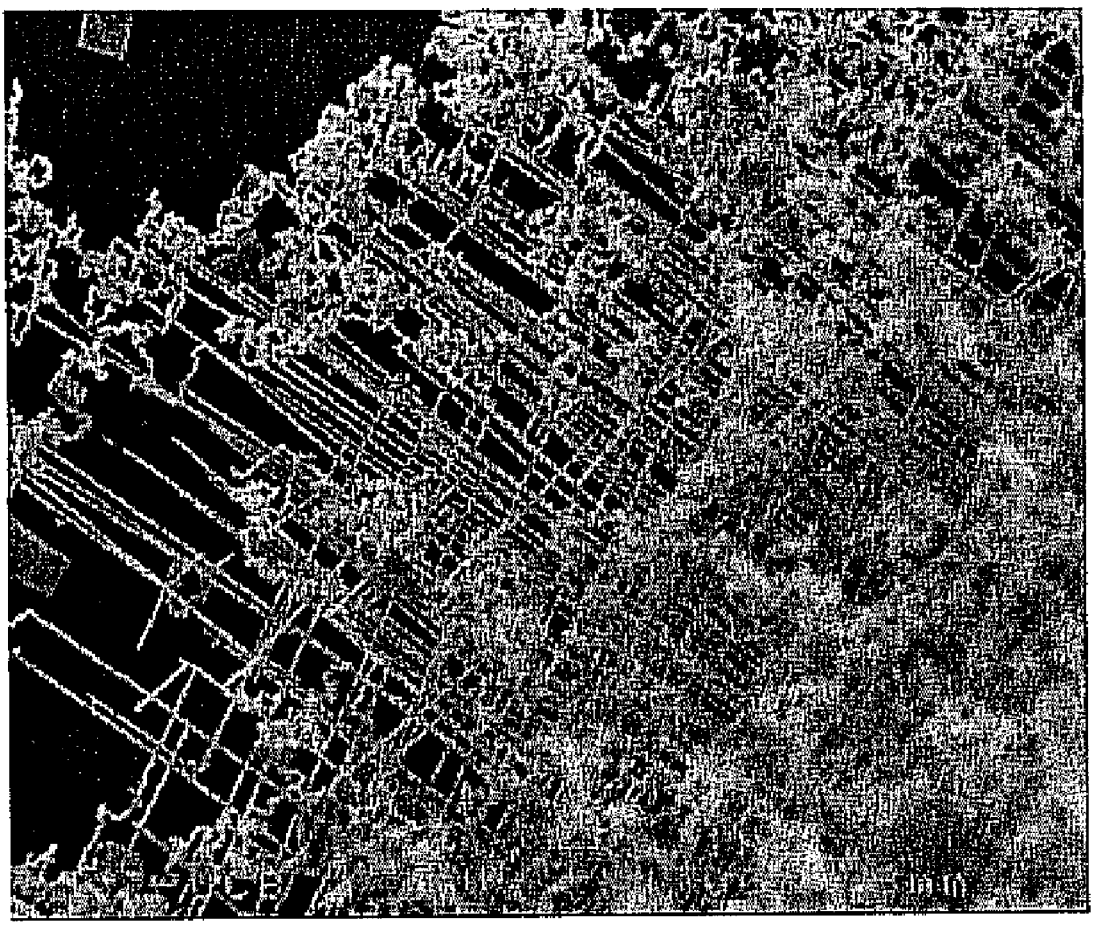
FIG. 2 is a SEM photomicrograph of PbS nanowires.
Figure 3:
FIG. 3 is a higher magnification of the nanowires shown in FIG. 2.
Figure 4:
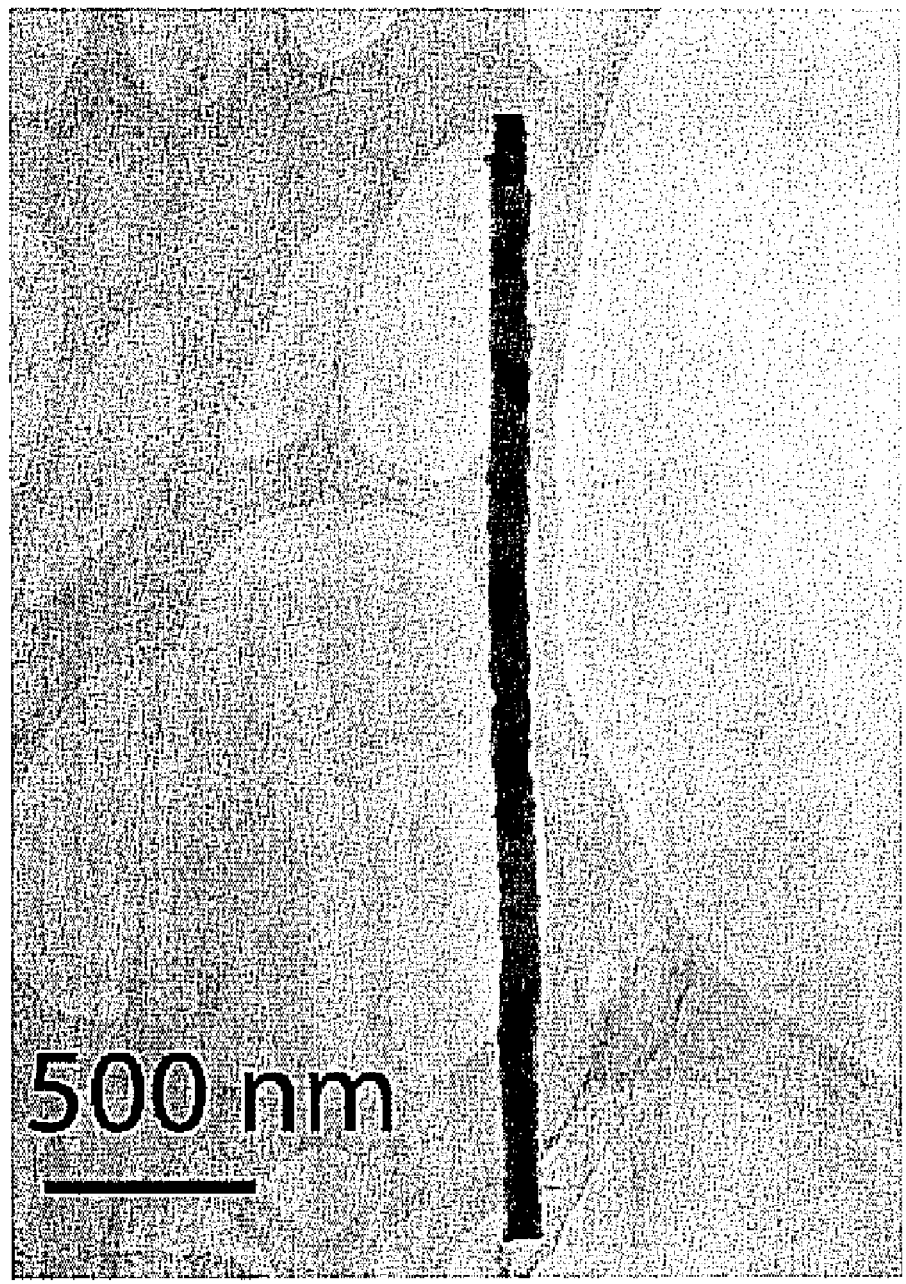
FIG. 4 is a TEM photomicrograph of a PbS nanowire.

The results of this method with the parameters described above were PbS nanowires with mean average diameters ranging from 40 to 100 nanometers (nm) and lengths ranging from 10 to 70 microns (μm). The growth direction of the nanowires was in the [100] direction. In addition, an amorphous silica coating layer was produced on the nanowires. After the method of the first embodiment was performed with the above-described parameters and production of the PbS nanowires was accomplished, the wires were etched with hydrofluoric acid to remove the amorphous silica coating. In the alternative, the PbS nanowires were not etched with hydrofluoric acid and are capable of being used with the amorphous silica coating present. FIG. 2 shows a scanning electron microscopy (SEM) photomicrograph of the PbS nanowires produced using the method of the first embodiment and the parameters given above. FIG. 3 shows a higher SEM magnification of the PbS nanowires shown in FIG. 2. In addition, FIG. 4 shows a transmission electron microscopy (TEM) photomicrograph of a single crystalline PbS nanowire.

Example 2

Figure 5:
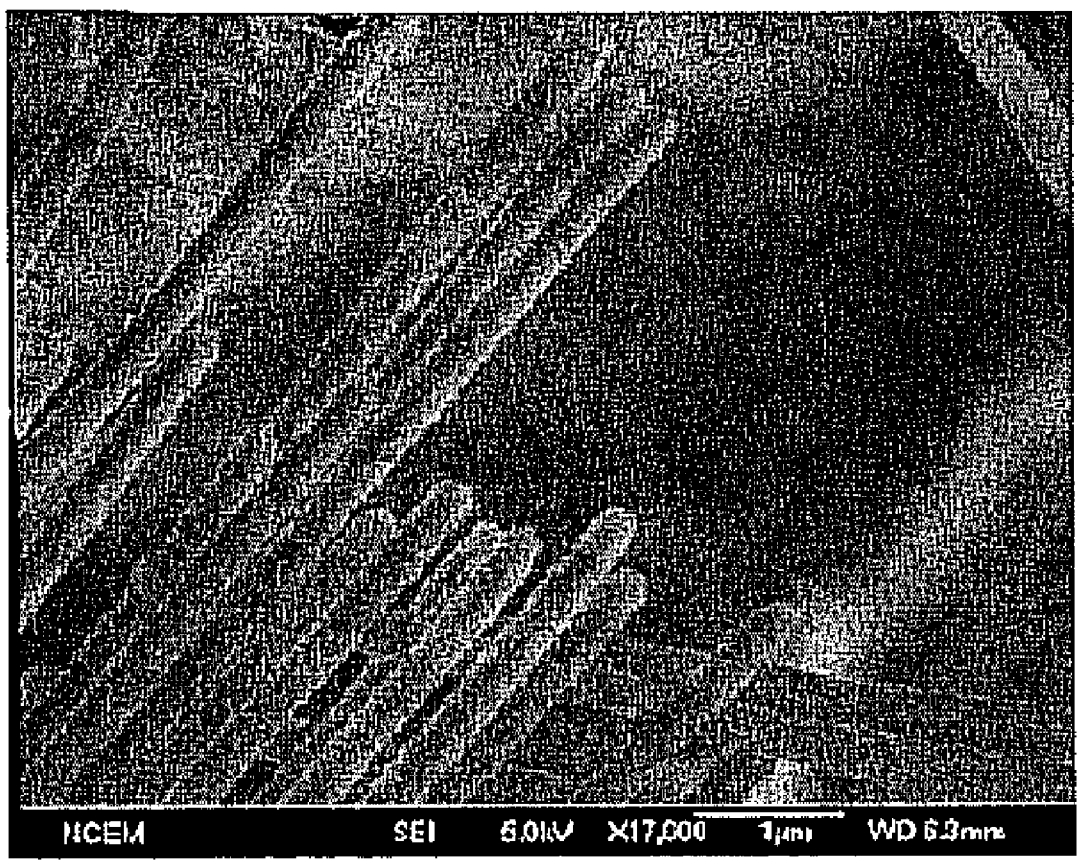
FIG. 5 is an SEM photomicrograph of PbSe nanowires.
Figure 6:
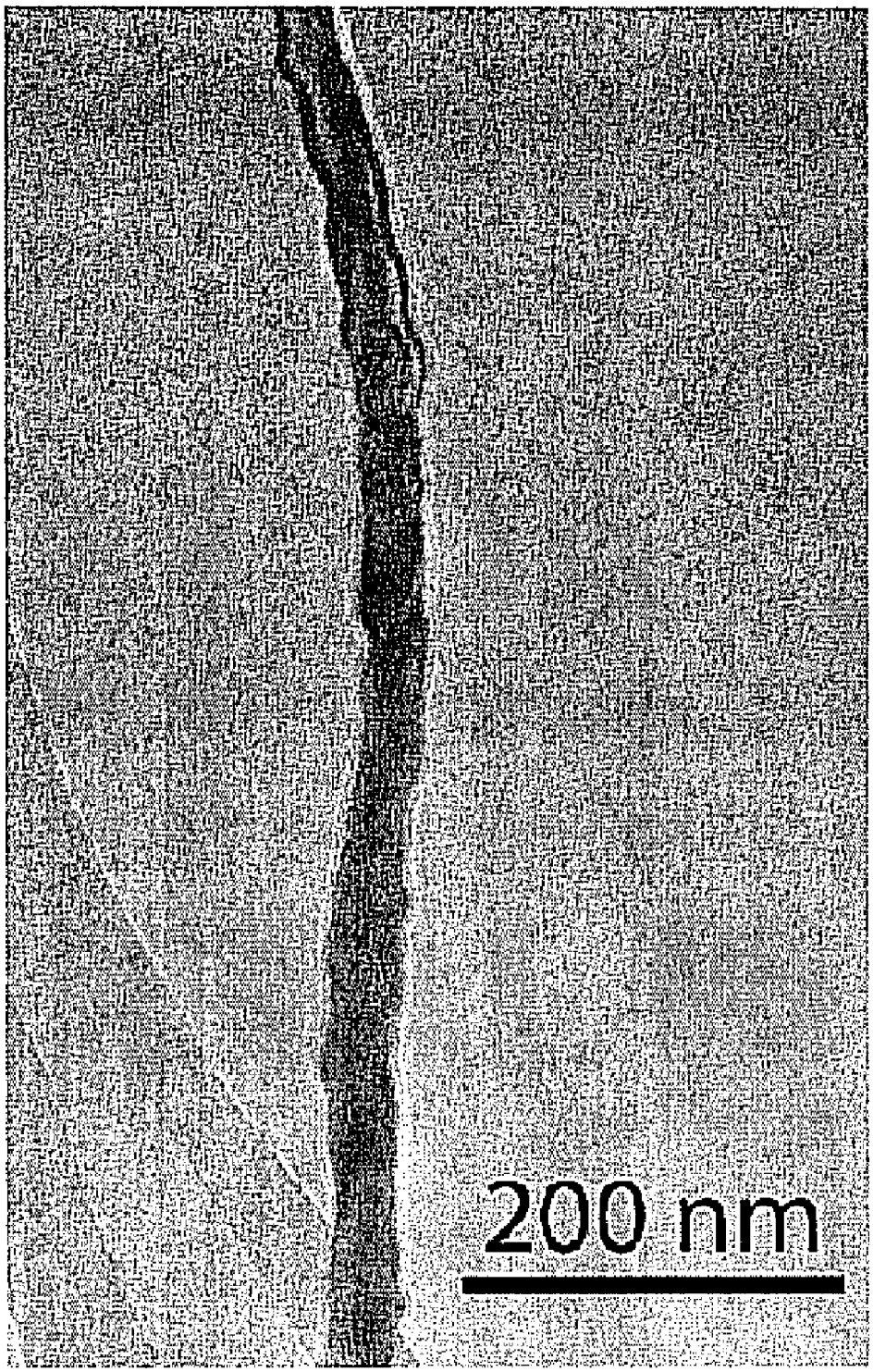
FIG. 6 is a TEM photomicrograph of a PbSe nanowire.

Lead selenium (PbSe) nanowires were produced using the first embodiment of the present invention. The furnace 170 was used to heat the reaction chamber 100 and the contents therein to a temperature between 700 and 1100° C. Preferably, the temperature of the reaction chamber 100 and contents therein is between 850 and 1000° C. The carrier gas 130 was comprised of nitrogen with 5 volume percent hydrogen and a gas flow rate of between 5 to 60 sccm. The precursor 140 included $PbCl_2$ and Se. The ratio of the mass of $PbCl_2$ to Se was between 1:1 and 1:5, and preferably is 1:2.4. FIG. 5 shows an SEM photomicrograph of the PbSe nanowires produced. The average mean diameter of the PbSe nanowires ranged from 40 to 200 nm, with lengths ranging from 10 to 100 μm. The growth direction of the nanowires was in the [100] direction. Similar to the nanowires described in Example 1 above, the PbSe nanowires had an amorphous silica coating thereon and can be used with or without said coating present. FIG. 6 shows a TEM photomicrograph of one of the PbSe nanowires.

Example 3

Figure 7:
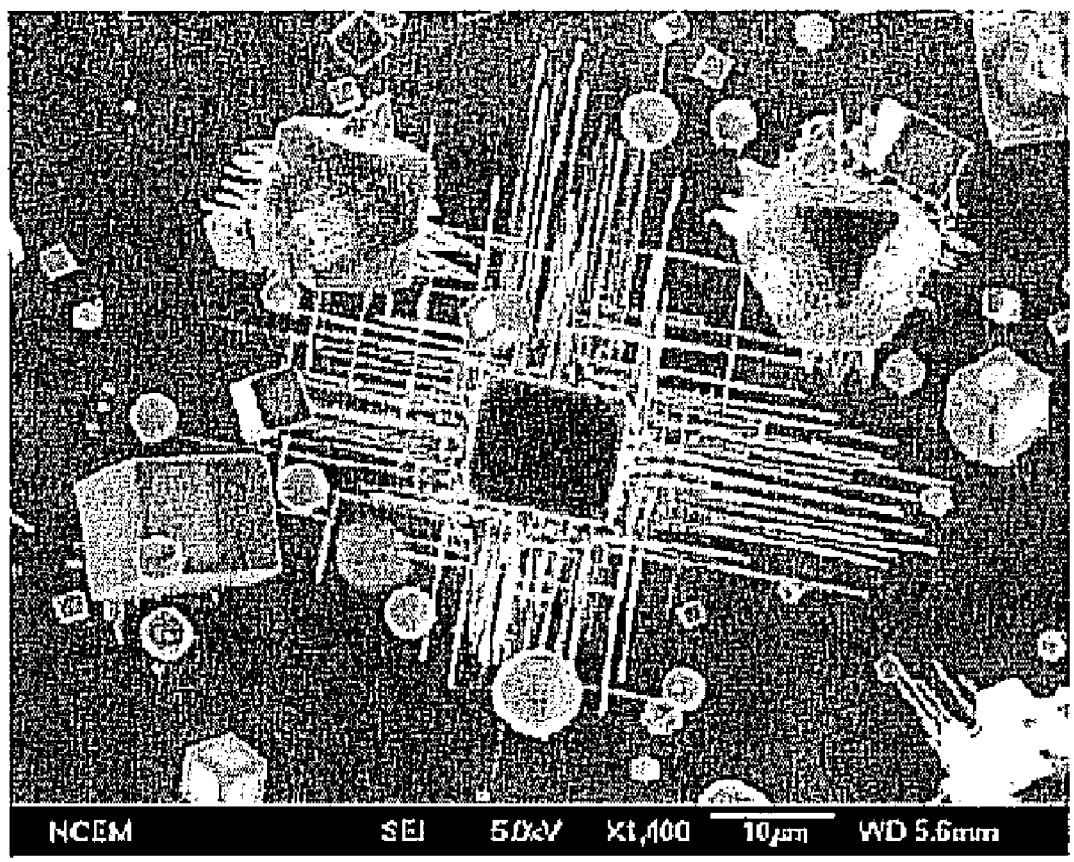
FIG. 7 is an SEM photomicrograph of PbTe nanowires.

The first embodiment of the present invention was used to form and grow lead tellurium (PbTe) nanowires (FIG. 7). The furnace 170 was used to heat the reaction chamber 100 and the contents therein to a temperature between 700 and 1000° C. Preferably the temperature is between 750 and 950° C. The carrier gas was comprised of nitrogen with 5 volume percent hydrogen and had a flow rate of between 2 and 200 sccm. Preferably the gas flow rate was between 5 and 150 sccm. The precursor 140 was comprised of $PbCl_2$ and Te. The ratio of $PbCl_2$ to Te was between 1:1 and 1:5, and preferably was 1:2.4. The mean linear diameter of the nanowires produced using the above-stated parameters was between 100 to 200 nm and the lengths were between 40 to 100 μm. The growth direction of the lead tellurium nanowires was in the [100] direction. These nanowires also had an amorphous silica coating thereon.

Figure 8:
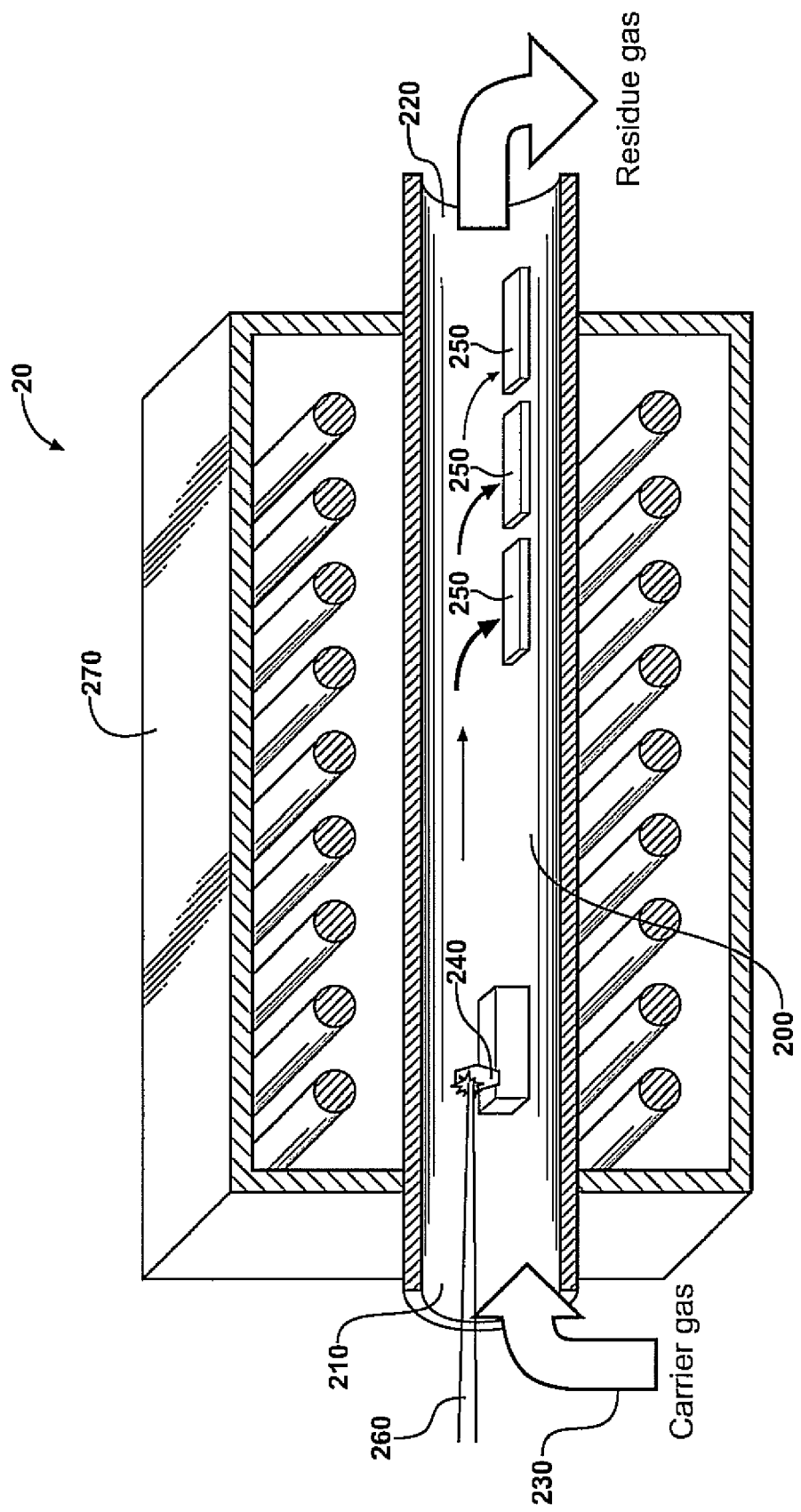
FIG. 8 is a schematic diagram of a second embodiment of the present invention.

A second embodiment of the present invention is illustrated in FIG. 8, wherein a reaction chamber 200, a carrier gas 230, a precursor target 240, a collection substrate 250 and a laser beam 260 are used to nucleate and grow nanowires. The reaction chamber 200 has an inlet end 210 and an exit end 220. The carrier gas 230 is caused to flow through the reaction chamber 200 by entry through the inlet end 210 and exit through the exit end 220. A furnace 270 is used to heat the reaction chamber 200 and the contents therein. The laser beam 260 is focused on the precursor target 240 and affords for the evaporation of the target 240 material into the carrier gas 230. The carrier gas 230 transports the target 240 material to the collection substrate 250. Deposition of the target 240 material onto the collection substrates 250 affords for the nucleation and growth of nanowires.

The reaction chamber 200 is made from any material known to those skilled in the art, illustratively including alumina, silica, mullite and combinations thereof. The carrier gas 230 is typically comprised of an inert and/or noble gas. In addition, a reducing gas, for example hydrogen, may be included. The precursor target is typically comprised of PbX, wherein X is S, Se, Te and combinations thereof. The furnace 270 is used to heat the reaction chamber 200 and the contents therein to temperatures up to 1200° C. In the alternative the furnace 270 is used to heat the reaction chamber 200 and the contents therein to temperatures above 1200° C.

Examples of the nucleation and growth of nanowires using the method of the second embodiment are provided below for illustrative purposes only and in no way limit the scope of the invention. It is important to note that no catalyst or catalytic particles, droplets, wires or any other type of article was present or was used in the present invention.

Example 4

Figure 9:
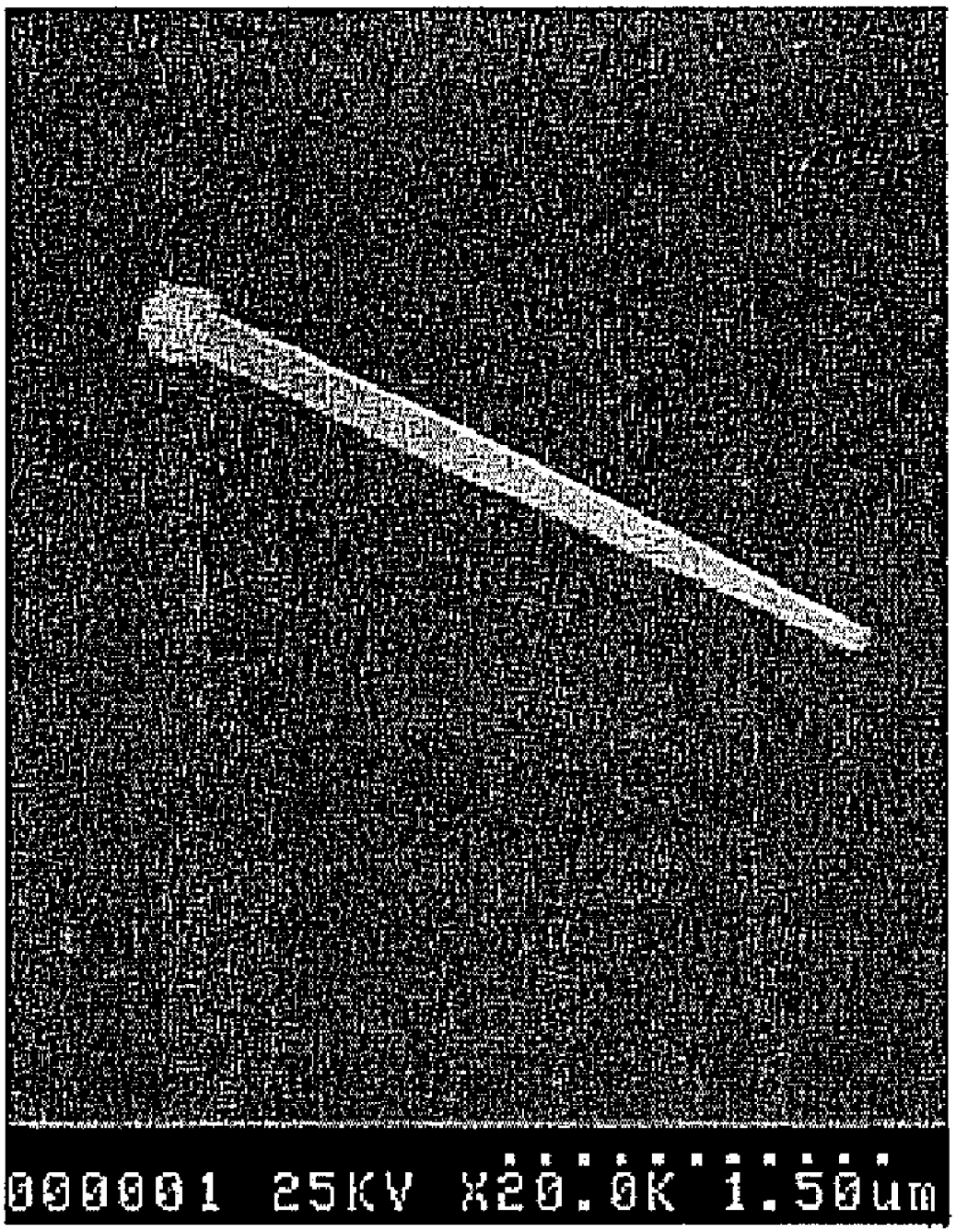
FIG. 9 is an SEM photomicrograph of a PbSe nanowire.

FIG. 9 shows a PbS nanowire nucleated and grown using the second embodiment described above. The laser beam 260 was focused and pulsed onto the precursor target 240. The precursor target 240 was PbS. The carrier gas 230 was argon with 5 volume percent hydrogen. The furnace 270 was used to heat the reaction chamber 200 and the contents therein to temperatures between 500 and 800° C. Preferably the reaction chamber 200 was heated to a temperature between 550 and 650° C. The gas flow rate of the carrier gas 230 was between 5 and 200 sccm, and preferably between 25 and 100 sccm. The carrier gas 230 was maintained at a pressure within the reaction chamber 200, said pressure being between 50 and 500 torr, and preferably being between 200 and 400 torr. The mean linear diameter of the PbS nanowires nucleated and grown using the above-stated parameters was between 25 to 75 nanometers with an aspect ratio of between 5 to 15. For purposes of the present invention, aspect ratio is defined as the ratio of the length to the width/diameter of the nanowires.

From the foregoing, it can be seen that the present invention provides a method for the self-catalytic nucleation and growth of nanowires. Having described the invention, however, many modifications thereto will become apparent to those skilled in the art to which it pertains without deviation from the spirit of the invention as defined by the scope of the appended claims. Although the examples were given to aid in the understanding of the present invention, the examples are not intended to limit the scope of the method. The scope of the invention is provided by the scope of the claims.

The invention claimed is:

1. A method for the non-catalytic growth of nanowires comprising:
    providing a reaction chamber, said chamber having an inlet end and an exit end;
    providing a furnace;
    heating said chamber to an elevated temperature using said furnace;
    providing a gas;
    flowing said gas into said reaction chamber through said inlet end and exiting said furnace through said exit end;
    providing a precursor selected from the group consisting of $PbCl_2$, $SeCl_2$, $TeCl_2$, S and combinations thereof; and
    providing a substrate wherein nanowires nucleate and grow on said substrate without the use of a catalyst.

2. The method of claim 1, wherein said nanowires include PbS nanowires.

3. The method of claim 2, wherein said PbS nanowires include an amorphous silica coating thereon.

4. The method of claim 2, wherein said reaction chamber is heated to a temperature between 500 and 900 degrees centigrade.

5. The method of claim 2, wherein said gas includes nitrogen gas.

6. The method of claim 5, wherein said reaction chamber is heated to a temperature between 700 and 1000 degrees centigrade.

7. The method of claim 2, wherein said gas enters and exits said reaction chamber with a gas flow rate between 50 and 150 standard cubic centimeters per minute.

8. The method of claim 2, wherein said precursor includes $PbCl_2$ and S.

9. The method of claim 1, wherein said nanowires include PbSe nanowires.

10. The method of claim 9, wherein said PbSe nanowires include an amorphous silica coating thereon.

11. The method of claim 9, wherein said reaction chamber is heated to a temperature between 700 and 1100 degrees centigrade.

12. The method of claim 9, wherein said gas is selected from the group consisting of nitrogen, hydrogen and combinations thereof.

13. The method of claim 9, wherein the gas flow rate is between 2 and 100 standard cubic centimeters per minute.

14. The method of claim 9, wherein said precursor includes $PbCl_2$ and Se.

15. The method of claim 1, wherein said nanowires include PbTe nanowires.

16. The method of claim 15, wherein said PbTe nanowires include an amorphous silica coating thereon.

17. The method of claim 15, wherein said gas is selected from the group consisting of nitrogen, hydrogen and combinations thereof.

18. The method of claim 15, wherein the gas flow rate is between 2 and 200 standard cubic centimeters per minute.

19. The method of claim 15, wherein said precursor includes $PbCl_2$ and Te.

20. A method for the non-catalytic growth of nanowires comprising:
    providing a reaction chamber, said chamber having an inlet end and an exit end;
    providing a furnace;
    heating said chamber to an elevated temperature using said furnace;
    providing a gas;
    flowing said gas into said reaction chamber through said inlet end and exiting said furnace through said exit end;
    providing a PbX precursor target, wherein X is selected from the group consisting of Se, Te, S and combinations thereof;
    providing a laser beam;
    focusing said laser beam on said precursor target; and
    providing a substrate wherein nanowires form nucleate and grow on said substrate without the use of a catalyst.

21. The method of claim 20, wherein said laser beam is a pulsed laser beam.

22. The method of claim 20, wherein said reaction chamber is heated to a temperature between 500 and 800 degrees centigrade.

23. The method of claim 20, wherein said gas is selected from the group consisting of argon, hydrogen and combinations thereof.

24. The method of claim 20, wherein said gas is within said reaction chamber at a gas pressure of between 80 and 120 torr.

* * * * *

UNITED STATES PATENT AND TRADEMARK OFFICE
CERTIFICATE OF CORRECTION

| | | |
|---|---|---|
| PATENT NO. | : 7,781,317 B2 | Page 1 of 1 |
| APPLICATION NO. | : 11/619413 | |
| DATED | : August 24, 2010 | |
| INVENTOR(S) | : Joshua Goldberger et al. | |

It is certified that error appears in the above-identified patent and that said Letters Patent is hereby corrected as shown below:

Column 3 line 49 replace "scam" with --sccm--

Column 6 line 51 delete "form"

Signed and Sealed this
Tenth Day of May, 2011

David J. Kappos
*Director of the United States Patent and Trademark Office*